United States Patent [19]
Yamamoto et al.

[11] Patent Number: 5,438,209
[45] Date of Patent: Aug. 1, 1995

[54] APPARATUS FOR DETECTING POSITION OF A NOTCH IN A SEMICONDUCTOR WAFER

[75] Inventors: Satoshi Yamamoto; Kenji Kamei, both of Kyoto, Japan

[73] Assignee: Dainippon Screen Mfg. Co., Inc., Kyoto, Japan

[21] Appl. No.: 12,346

[22] Filed: Feb. 2, 1993

[30] Foreign Application Priority Data

Feb. 3, 1992 [JP] Japan ................... 4-048090

[51] Int. Cl.$^6$ ............................................. G01N 21/86
[52] U.S. Cl. ................. 250/559.29; 250/548; 356/375
[58] Field of Search ............. 250/561, 572, 563, 548; 356/375, 400, 422, 423, 237

[56] References Cited

U.S. PATENT DOCUMENTS 4,466,073 8/1984 Boyan et al. .................... 356/400
4,887,904 12/1989 Nakazato et al. ................ 356/375

FOREIGN PATENT DOCUMENTS 0373553 3/1991 Japan .

Primary Examiner—David C. Nelms
Attorney, Agent, or Firm—Ostrolenk, Faber, Gerb & Soffen

[57] ABSTRACT

A semiconductor wafer placed on a table is rotated by a stepper motor stepwise by a broad pitch. At this time, a CCD line sensor transmits output signals to comparators. A CPU monitors output signals of the comparators and detects a notch formed in the wafer. After the notch is detected, the wafer is rotated stepwise by a fine pitch, and outer peripheral positional data of a notched region (outputs of an analog-to-digital converter) are sampled and stored in a RAM. The CPU computes a notch position from the outer peripheral positional data stored in the RAM. In this way, a V-shaped notch formed in a semiconductor wafer is detected speedily and with high precision.

12 Claims, 7 Drawing Sheets

APPARATUS FOR DETECTING POSITION OF A NOTCH IN A SEMICONDUCTOR WAFER

BACKGROUND OF THE INVENTION (1) Field of the Invention

The present invention relates to an apparatus for detecting the position of a notch in a semiconductor wafer, and more particularly to an apparatus for detecting position in a V-shaped notch formed peripherally of a semiconductor wafer.

(2) Description of the Prior Art

Usually, semiconductor wafers are formed with what is called an orientation flat shaped by linearly cutting out a peripheral edge thereof, which is used in setting the wafers to a predetermined position. Japanese Patent Publication (Unexamined) No. 3-73553, for example, discloses a wafer position detecting apparatus which detects the position of an orientation flat as follows. First, a wafer having an orientation flat is rotated stepwise through predetermined angles on a rotating device. At stops of the rotation, outer peripheral positional data of the wafer are successively obtained by means of a one-dimensional image sensor. These outer peripheral positional data are stored in relation to angles of displacement of respective sampling points. Then, two sampling points are determined as having therebetween a sampling point providing the largest of all the outer peripheral positional data stored (i.e. a maximum distance from a predetermined position radially outwardly of the wafer to an opposite peripheral position of the wafer as detected by the one-dimensional image sensor). An angle of displacement, from a reference point, of a perpendicular extending from the center of rotation to the orientation flat is derived from the displacement angles and outer peripheral positional data of the two sampling points.

The prior apparatus noted above has the following drawback.

Among large size semiconductor wafers used recently, there are some that have a V-shaped notch formed peripherally thereof in place of the orientation flat. Such a notch has small dimensions; an opening angle approximately 90° and a distance about 1.0 mm from its apex to an outer periphery of the wafer. To detect the position of such a notch in the conventional manner noted above, outer peripheral positional data must be collected from numerous sampling points by rotating the wafer stepwise through very small angles. This notch detecting operation would be time-consuming.

SUMMARY OF THE INVENTION

Having regard to the state of the art noted above, an object of the present invention is to provide an apparatus for detecting the position of a V-shaped notch in a semiconductor wafer with high speed and precision. Other objects of the invention will be apparent from the preferred embodiment described later.

In order to fulfill the above object, a notch position detecting apparatus for detecting a notch formed peripherally of a semiconductor wafer, according to the present invention, comprises rotating means for rotating said wafer; image pickup means for detecting outline positions of said wafer; control means for controlling and selectively driving said rotating means in stepwise rotation at a predetermined relatively broad pitch and in stepwise rotation at a predetermined relatively fine pitch; detecting means responsive to the image pickup means for generating outer peripheral positional data and for determining the presence or the or absence of said notch; switch means for causing said control means to rotate said rotating means at the fine pitch after said detecting means detects said notch; storage means for storing the outer peripheral positional data generated by said detecting means timing means for periodically causing the outer peripheral positional data from said detecting means to be inputted into said storage means when said control means drives said rotating means at the fine pitch; and computing means for computing a notch position from the outer peripheral positional data stored in said storage means.

According to the notch position detecting apparatus embodying the present invention, the control means first drives the rotating means in stepwise rotation by a relatively broad pitch and at a relatively high speed. During this stepwise rotation, the detecting means monitors variations in the outputs of the image pickup means. The outputs of the image pickup means show characteristic variations when the notch formed in the wafer passes by the image pickup means. The detecting means observes these variations to determine that the notched region has reached a position approximately opposite the image pickup means. Once the notch is detected, the control means drives the rotating means in stepwise rotation by a relatively fine pitch and at a relatively low speed. The timing means provides timing for finely sampling outer peripheral positional data of the notched region through the image pickup means. These outer peripheral positional data are stored in the storage means. The computing means computes a notch position from the outer peripheral positional data of the notched region stored in the storage means.

Thus, the notch formed in the wafer is detected first while rotating the wafer stepwise by a broad pitch. Thereafter the outer peripheral positional data of the notched region are finely sampled while rotating the wafer stepwise by a fine pitch. The notch position is computed from these outer peripheral positional data. Consequently, this apparatus is capable of detecting the notch position faster than the conventional apparatus which detects the notch position by rotating the wafer stepwise by a fine pitch from the start, and sampling numerous outer peripheral positional data from the entire circumference of the wafer.

According to the present invention, the notched region is detected quickly through the broad stepwise rotation, allowing sufficient time for sampling the outer peripheral positional data from the notched region with a considerable degree of fineness. The precision in detecting the notch position is all the higher because of the fine sampling.

BRIEF DESCRIPTION OF THE DRAWINGS

For the purpose of illustrating the invention, there are shown in the drawings a form which is presently preferred, it being understood, however, that the invention is not limited to the precise arrangements and instrumentalities shown.

DETAILED DESCRIPTION OF THE PREFERRED EMBODIMENTS

An embodiment of the present invention will be described with reference to the drawings.

Figure 1:
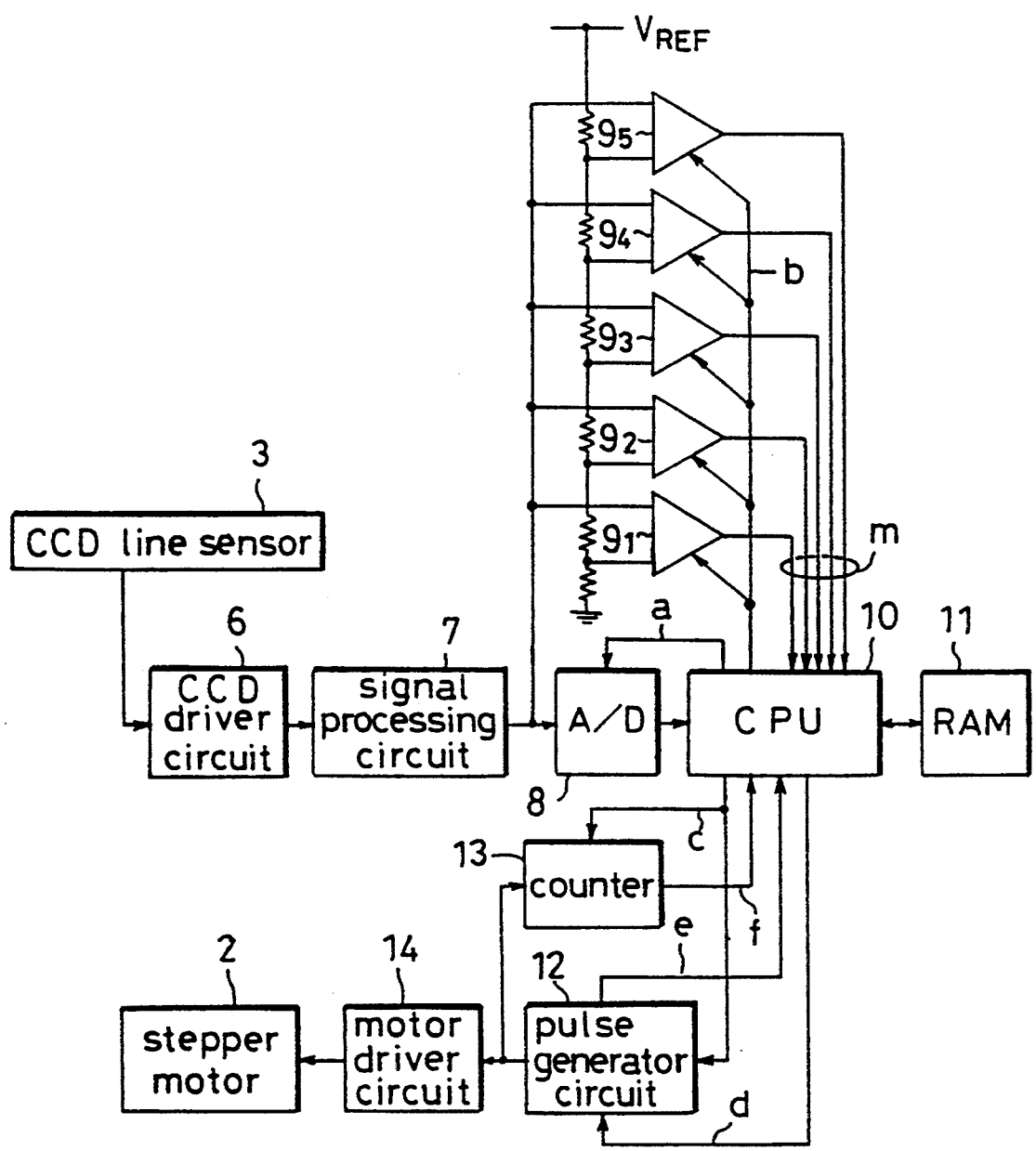
FIG. 1 is a block diagram schematically showing an apparatus for detecting a notch formed in a semiconductor wafer according to the present invention.
Figure 2:
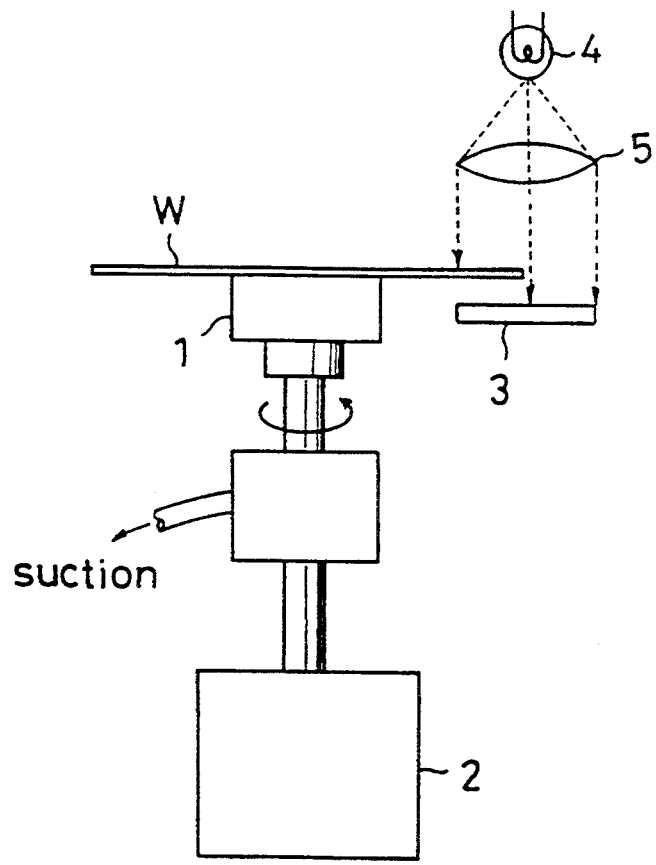
FIG. 2 is a front view of a wafer rotating device of the detecting apparatus.
Figure 3:
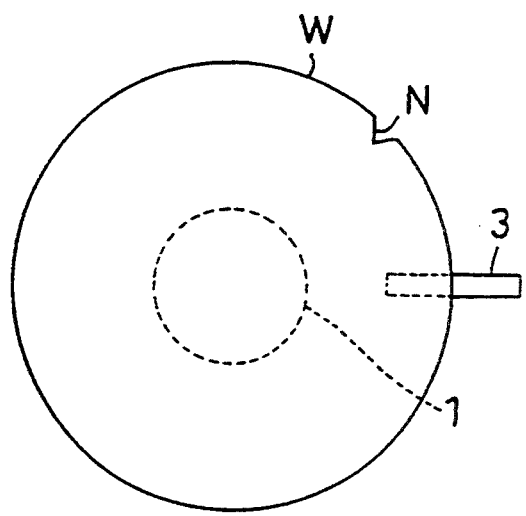
FIG. 3 is plan view of the wafer rotating device.

FIG. 1 is a block diagram schematically showing an apparatus for detecting position of a notch formed in a semiconductor wafer according to the present invention. FIG. 2 is a front view of a wafer rotating device. FIG. 3 is a plan view of the wafer rotating device.

In FIGS. 2 and 3, reference W denotes a semiconductor wafer having a V-shaped notch N formed peripherally thereof to provide a basis for setting the wafer W to a predetermined position. Numeral 1 denotes a table for suction-supporting the wafer W. The table 1 is rotatable in forward and backward directions alike by a stepper motor 2. One complete rotation of the wafer W is divided into plural steps performed by the stepper motor 2, which receives 500 pulses from pulse generator circuit 12 detailed hereinbelow. Incidentally, the term "step" referred to above is, needless to say, different from the "step" described with respect to the flowchart and illustrated in FIGS. 5 and 6. Numeral 3 denotes a CCD line sensor for detecting outline positions of the wafer W. A light source 4 and an optical system 5 are arranged above the CCD line sensor 3 for use in detecting the outline positions.

Referring to FIG. 1, the CCD line sensor 3 includes numerous elements, and these elements output respective detection signals. The CCD line sensor 3 is driven by a CCD driver circuit 6 to continuously detect outline positions of the wafer W independently of rotation of the stepper motor 2. The detection signals are successively applied to a signal processing circuit 7. Based on the detection signals from the CCD line sensor 3, the signal processing circuit 7 outputs analog signals proportional to the number of elements in the CCD line sensor 3 having received light emitted from the light source 4. These analog signals are applied to an analog-to-digital converter 8 and comparators 91–95. A CPU 10 applies a data intake timing signal "a" to the analog-to-digital converter 8. In response to this timing signal "a", the converter 8 converts the analog signals inputted thereto to digital signals. These digital signals are transmitted through the CPU 10 to a RAM 11 to be stored therein as outer peripheral positional data.

Figure 4:
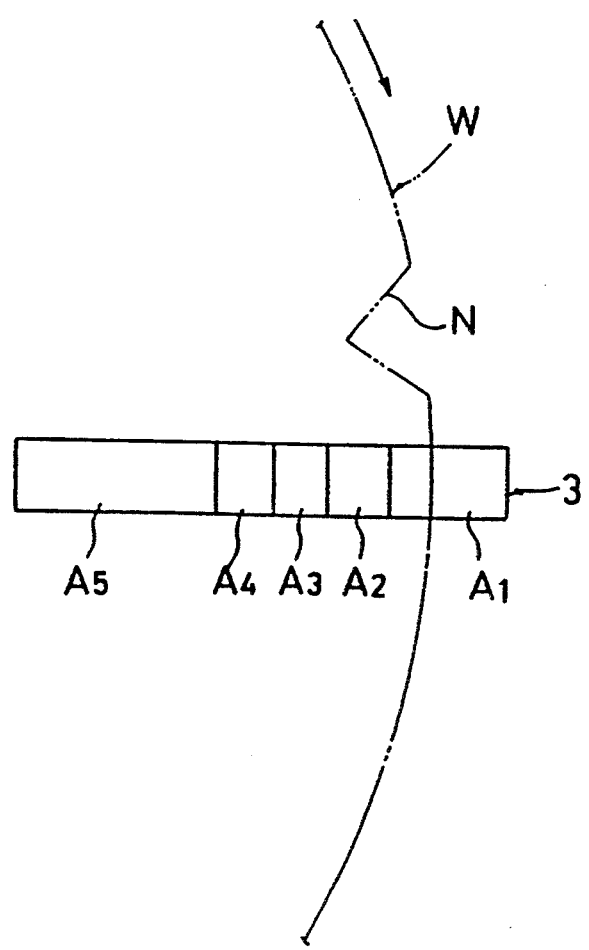
FIG. 4 is an explanatory view of divisions of a CCD line sensor.

Each of the comparators 91–95 receives, at one of the inputs thereof, a reference voltage of its own which is produced by dividing a voltage VREF. Each comparator compares the reference voltage and the analog signal received from the signal processing circuit 7 to determine opposed relations between peripheries of the wafer W and regions of the CCD line sensor 3. Specifically, as shown in FIG. 4, for example, the CCD line sensor 3 has a light receiving region including all of the elements, which is virtually divided into five regions A1–A5 each including a plurality of elements. When an outer periphery of the wafer W is opposed to region A1, the comparator 91 outputs an "H" level signal. When an outer periphery of the wafer W is opposed to region A2, both of the comparators 91 and 92 output "H" level signals.

When the notch N traverses the CCD line sensor 3, output signals "m" of the comparators 91–95 undergo characteristic variations. The notch N may be detected by perceiving these variations. As described in detail below, the CPU 10 outputs a strobe signal "b" to the respective comparators 91–95 a plurality of times per step of rotation during stepwise rotation of the wafer W and reads output signals "m" of the comparators 91–95 each time to determine whether the notch N of the wafer W has traversed the CCD line sensor 3 or not.

The functions of the comparators 91–95 and CPU 10 in this embodiment may be replaced with a similar function performed by the CPU to carry out an arithmetic operation of the digital signals outputted from the analog-to-digital converter 8 (e.g. in a software mode where the analog signals outputted from the CCD line sensor 3, which are proportional to the number of elements in the CCD line sensor 3, are converted to digital signals by the analog-to-digital converter 8, and the CPU 10 determines whether the digital signals exceed a predetermined digital value or not).

The CPU 10, a pulse generator circuit 12 and a counter 13 control the stepwise rotation of the stepper motor 2. The pulse generator circuit 12 outputs a predetermined number of pulses at a predetermined speed to a motor driver circuit 14 in response to a number of rotation data "c" received along with a rotating direction control signal from the CPU 10. The pulse generator circuit 12 has an internal counter, not shown, for counting the number of pulses outputted to the motor driver circuit 14. A count of the internal counter is latched in response to a latch signal "d" received from the CPU 10. This count, which represents the number of pulses (hereinafter called a cumulative pulse data) "e" outputted from start of the stepwise rotation to a point of time at which the latch signal is inputted, is applied to the CPU 10. The counter 13 is a programmable counter to which the CPU 10 presets the number of rotation data "c". The counter 13 outputs a count-up signal "f" to the CPU 10 when the pulse generator circuit 12 outputs the number of pulses corresponding to the number of rotation data "c".

As noted hereinbefore, the CPU 10 has a function to determine timing for accepting the outer peripheral positional data from the CCD line sensor 3. The CPU 10 also has a function to compute position of the notch N formed in the wafer W, from the outer peripheral positional data stored in the RAM 11. This function will be described in detail below in connection with operation of the apparatus.

Operation of this apparatus will be described next with reference to the flowchart shown in FIG. 5.

When the wafer W is set to the table 1, the CPU 10 outputs to the analog-to-digital converter 8 the timing signal "a" for accepting the outer peripheral positional data. As a result, the outer peripheral positional data obtained as a sampling point at θ-address "0", i.e. obtained as a point originally opposed to the CCD line sensor 3, is transmitted to the CPU 10 and stored in the RAM 11 (step S1).

When the first outer peripheral positional data is received, the CPU 10 applies the number of rotation data "c", along with the rotating direction control signal, to the pulse generator circuit 12 for rotating the wafer W stepwise by a relatively broad pitch and at a relatively high speed. The number of rotation data "c" applied here provides, for example, 500 pulses corresponding to an angle of 9° for the stepwise rotation. This number of rotation data "c" is applied also to the counter 13 to preset the latter. The pulse generator circuit 12 then outputs the number of pulses corresponding to the number of rotation data "c" at 8000 pulses per second to drive the stepper motor 2. As a result, the wafer W is rotated stepwise by a relatively broad pitch at a relatively high speed (step S2).

While the wafer W is rotated stepwise by the broad pitch, the CPU 10 carries out interrupt processing at predetermined intervals of time (e.g. approximately 10 to approximately 20 times for each move through 9 degrees in one broad step defined by 62.5 msec. (i.e. 500/8000 sec.)) to read the output signals of the comparators 91–95 and check for the notch N. When the notch N is detected, the outer peripheral positional data are finely sampled from its neighborhood to determine position of the notch N (step S3). The sequence of this processing will be described hereinafter with reference to the flowchart shown in FIG. 6.

The CPU 10 successively sets the output signals "m" ($m_1$, $m_2$, $m_3$, ...) of the comparators 91–95 to internal registers R (R1, R2, ...) (step S31). The output signal $m_1$ received first is set to the internal register R1, and the next output signal $m_2$ is set to the internal register R2. A comparison is then made between data [R1] set to the internal register R1 and data [R2] set to the internal register R2 to determine which is the greater of the two data (step S32). If data [R2] is greater than data [R1], the operation proceeds to step S33 for comparing data [R2] (i.e. output signal $m_2$) and data [R3] (i.e. output signal $m_3$) set to the register R3. If data [R3] is smaller than data [R2], it means that the notch N is detected and the operation proceeds to step S37.

Figure 7:
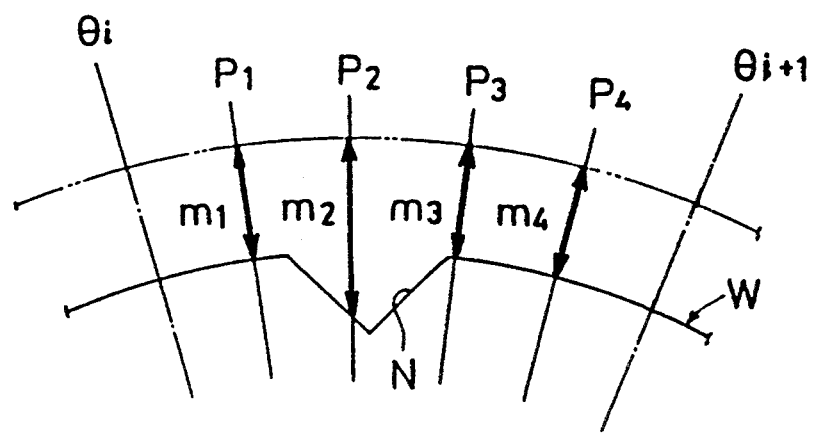
FIG. 7 is an explanatory view showing an example of interrupt timing in the notch detection processing.

The notch detection processing carried out at steps S32 and S33 will particularly be described with reference to FIG. 7. In FIG. 7, references P1, P2, P3, ... denote points of time at which the CPU 10 takes in the output signals "m" of the comparators 91–95 through the interrupt processing. References $m_1$, $m_2$, $m_3$, ... denote the output signals of the comparators 91–95 inputted to the CPU 10 at the points of time P1, P2, P3, ..., respectively. When the notch N traverses the CCD line sensor 3, the output signals "m" of the comparators 91–95 are variable to satisfy the relationships $m_2 > m_1$ and $m_3 < m_2$. Thus, the notch N may be detected by comparing the contents of internal registers R1–R3 as described above.

If, at step S32, the relationship [R2]>[R1] is not established, the operation proceeds to step S34 for setting data [R2] (or output signal $m_2$) in the register R2 to the register R1. Then, the operation returns to step S32 to set the next output signal $m_3$ to the register R2 and compare data [R1] and data [R2] again.

If, at step S33, the relationship [R3]<[R2] is not established, the operation proceeds to step S35 for comparing data [R4] (or output signal $m_4$) set to the register R4 and data [R3] (or output signal $m_3$) set to the register R3. If data [R4] is smaller than data [R3], it means that the notch N is detected and the operation proceeds to step S37.

Figure 8:
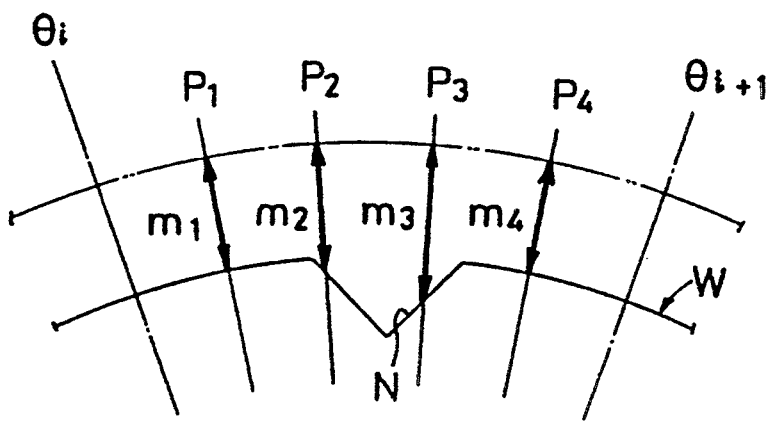
FIG. 8 is an explanatory view showing another example of interrupt timing in the notch detection processing.

The notch detection proceessing carried out at step S35 will particularly be described with reference to FIG. 8. Depending on timing of accepting the output signals "m" of the comparators 91–95, the relationships $m_2 > m_1$ and $m_3 > m_2$ may be established as shown in FIG. 8. In such a case, which of the output signals $m_3$ and $m_4$ is the greater is determined, and the notch N is regarded as having traversed the CCD line sensor 3 if signal $m_3$ is greater than signal $m_4$. Thus, if the relationship [R3]<[R2] is not established at step S33, then step S35 is executed to compare data [R4] and [R3].

If, at step S35, the relationship [R4]<[R3] is not established (e.g. the wafer W is placed eccentrically on the table 1 and the notch N is not detected yet), the operation proceeds to step S36 for setting data [R4] (or output signal $m_4$) in the register R4 to the register R1. Then, the operation returns to step S32 to set the next output signal $m_5$ to the register R2 and compare data [R1] and data [R2] again.

Figure 9:
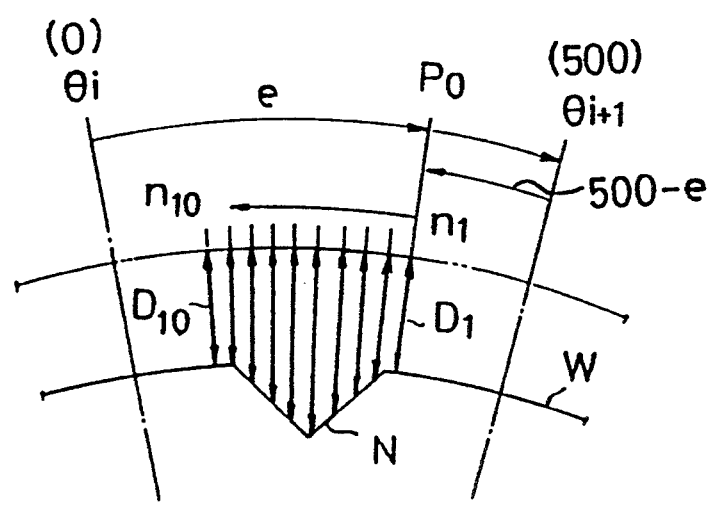
FIG. 9 is a view illustrating an operation for sampling outer peripheral positional data from a notched region.

When the notch N is detected, the CPU 10 outputs the latch signal "d" to the pulse generator circuit 12 at step S37. As a result, the pulse generator circuit 12 latches in an internal circuit thereof the cumulative pulse data "e" of the number of pulses generated before the latch signal "d" is inputted. This pulse data "e" is transmitted to the CPU 10 (step S38a). After outputting the latch signal "d", the CPU 10 temporarily stops output of the number of rotation data "c". Thus, the pulse generator circuit 12 stops the pulse output after outputting a predetermined number of pulses (500 pulses in this example) for the broad stepwise rotation. As a result, the broad stepwise rotation of the wafer W is discontinued (step S38b). FIG. 9 depicts this state. In FIG. 9, reference $\theta_i$ denotes a reference position of the CCD line sensor 3 for one step of the broad stepwise rotation, reference $P_0$ denotes a point of the CCD line sensor 3 at which the notch N is detected during the step (which corresponds to the point of time at which movement is made to step S37), and reference $\theta_{i+1}$ denotes a position of the CCD line sensor 3 for finishing the step and stopping the broad stepwise rotation.

When the broad stepwise rotation stops through the series of steps S37, S38a and S38b, the notch N is liable to have passed the position of the CCD line sensor 3. So the position of the CCD line sensor 3 relative to the wafer W is liable to be displaced from the point Po at which the CCD line sensor 3 detected the notch N, because the pitch of the step of the rotation is broad. In this embodiment, however, the cumulative pulse data "e" is utilized as described hereunder, to stop the wafer W precisely at the position that the CCD line sensor 3 opposes the notch detecting point $P_0$. Once the broad stepwise rotation is stopped, the CPU 10 applies to the pulse generator circuit 12 a number of rotation data (500−e) which corresponds to the cumulative pulse data "e" subtracted from the number of pulses for the broad stepwise rotation, along with a rotating direction control signal for backward rotation. As a result, the wafer W is rotated backward and stopped at the position where the notch N has been detected by the CCD line sensor 3, which opposes the point Po (step S39).

Subsequently, the CPU 10 applies a predetermined small number of rotation data "c" (i.e. 14 pulses in this embodiment) to the pulse generator circuit 12. The pulse generator circuit 12 then outputs the number of pulses corresponding to the number of rotation data "c"

at 1000 pulses per second. As a result, the wafer W is rotated stepwise backward by a relatively small pitch and at a relatively low speed. Then, the outer peripheral positional data are sampled at each stop of the stepwise rotation from the detection signals outputted from the respective elements of the CCD line sensor 3, with a degree of precision corresponding to the size of each element, and the sampled data are stored in the RAM 11. In FIG. 9, references $n_1, n_2, \ldots n_{10}$ denote the sampling positions arranged at minute intervals for detecting the notch position. References $D_1-D_{10}$ denote the outer peripheral positional data of the notched region of the wafer W collected from the sampling positions $n_1-n_{10}$, respectively.

Figure 10:
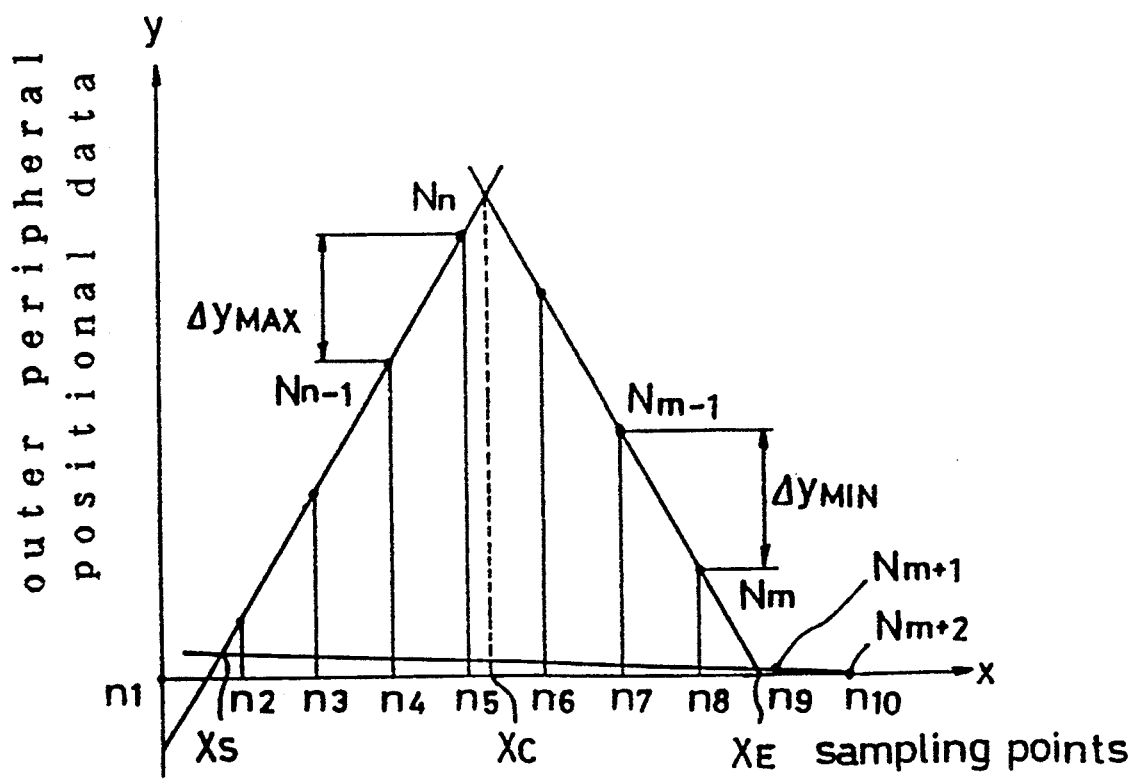
FIG. 10 is an explanatory view of a notch position computing operation.

After the predetermined number of outer peripheral positional data D1-D10 are collected, the CPU 10 derives the notch position from the outer peripheral positional data stored in the RAM 11, as follows (step S41). Reference will be made to FIG. 10 in which the sampling position $n_1$ provides the origin, the vertical axis represents the outer peripheral positional data, and the horizontal axis represents the sampling positions. Various points are plotted on this graph as sampling points, and are expressed by coordinates $N_i(x_i, y_i)$.

The CPU 10 successively computes differences between the outer peripheral positional data of adjacent pairs of sampling points, i.e. $\Delta y = y_i y_{i-1}$. In this way, the CPU 10 determines adjacent pairs of sampling points providing a maximum $\Delta y_{MAX}$ (or positive maximum difference) and a minimum $\Delta y_{MIN}$ (or negative maximum difference), respectively. Where an amount of displacement is the same, a sampling point having the larger "i" value is selected.

A straight line extending through the two sampling points $N_n$ and $N_{n-1}$ providing $\Delta y_{MAX}$ is expressed by the following equation (1):

$$y \approx \frac{y_n - y_{n-1}}{0.44} x + (n-1)y_{n-1} - (n-2)y_n \quad (1)$$

In the equation (1), "0.44" represents a distance between an adjacent pair of sampling positions in millimeters.

Similarly, a straight line extending through the two sampling points $N_{m-1}$ and $N_m$ providing $\Delta y_{MIN}$ is expressed by the following equation (2):

$$y \approx \frac{y_m - y_{m-1}}{0.44} x + (m-1)y_{m-1} - (m-2)y_m \quad (2)$$

The x coordinate of the point of intersection between the two straight lines derived from the equations (1) and (2) is expressed by the following equation (3), which point is regarded as the apex of the notch N:

$x_c \approx 0.44$
$\{(n-2)y_n - (n-1)y_{n-1} + (m-1)y_{m-1} - (m-2)y_m\}/(y_n - y_m - y_{n-1} + y_{m-1})$ (3)

The coordinate $x_c$ obtained as above is converted to the number of pulses for rotation $P_c$ from the notch detecting point P0 (i.e. the origin of the coordinate system shown in FIG. 10). In this embodiment, one complete rotation of the wafer W corresponds to 20000 pulses, and the diameter "r" of the wafer W is 100 mm. Thus, the number of rotating pulses $P_c$ is expressed by the following equation (4):

$$P_c = \frac{100x}{\pi} \quad (4)$$

Next, the starting point and ending point of the notch N are derived as follows.

A straight line extending through two sampling points $N_{m+1}$ and $N_{m+2}$ is derived from the following equation (5):

$$y \approx \frac{y_{m+2} - y_{m+1}}{0.44} x + (m+1)y_{m+1} - m \cdot y_{m+2} \quad (5)$$

The point of intersection between the straight line expressed by equation (5) and the straight line expressed by equation (1) is the notch starting point. Its position $x_S$ is expressed by the following equation (6):

$x_S \approx 0.44$
$\{(n-2)y_n - (n-1)y_{n-1} + (m+1)y_{m+1} - m \cdot y_{m+2}\}/(y_n - y_{m+2} - y_{n-1} + y_{m+1})$ (6)

The point of intersection between the straight line expressed by equation (5) and the straight line expressed by equation (2) is the notch ending point. Its position $x_E$ is expressed by the following equation (7):

$x_E \approx 0.44$
$\{m \cdot y_{m+2} - (m+1)y_{m+1} + (m-1)y_{m-1} - (m-2)y_m\}/(y_{m+2} - y_m - y_{m+1} + y_{m-1})$ (7)

The positions $X_s$ and $X_E$ derived from equations (6) and (7) may be expressed by the numbers of pulses $P_S$ and $P_E$ for rotation from the apex of the notch N as in the following equations (8) and (9):

$$P_S = P_c - \frac{100x_S}{\pi} \quad (8)$$

$$P_E = \frac{100x_E}{\pi} - P_c \quad (9)$$

Figure 6:
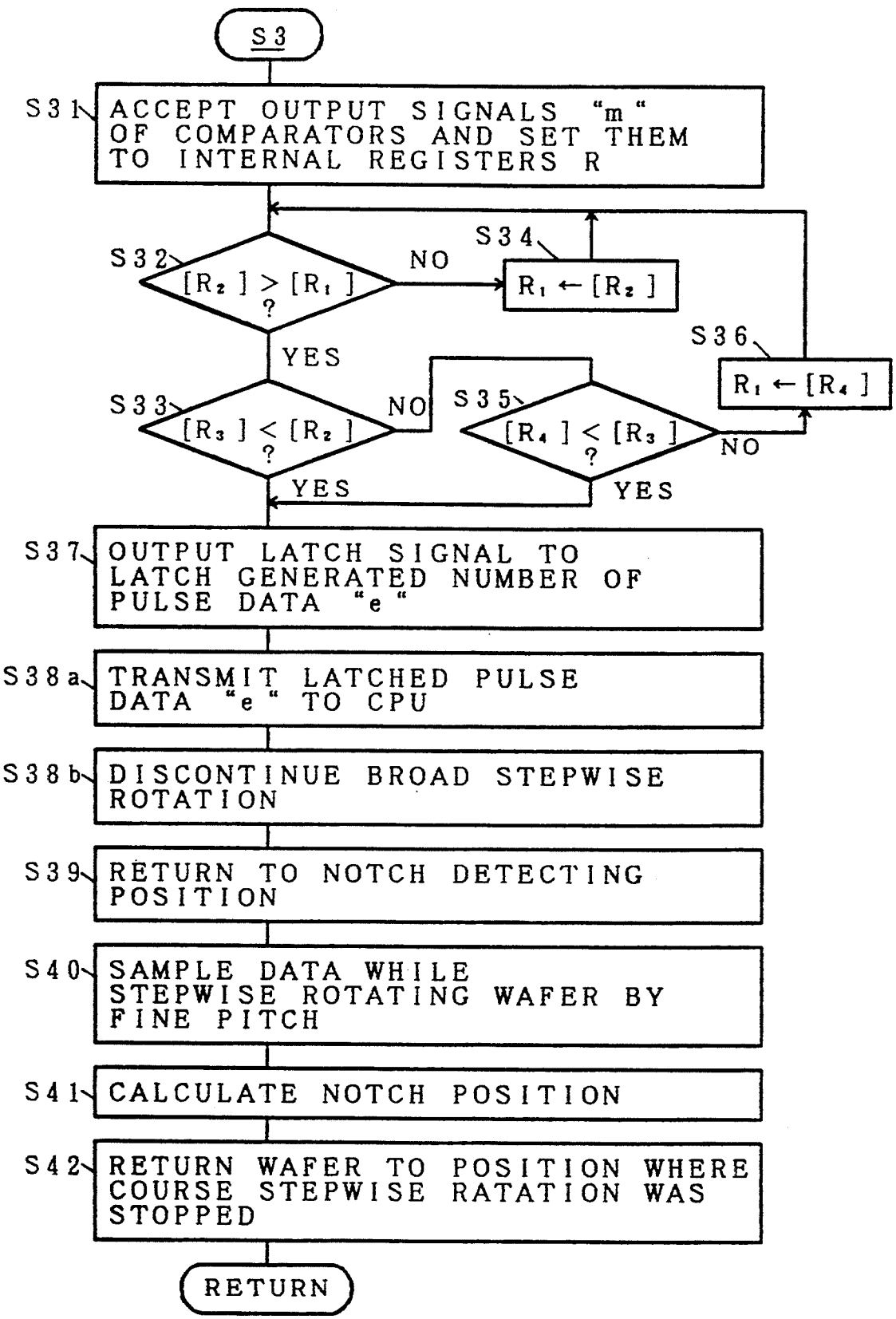
FIG. 6 is a flowchart showing details of notch detection processing.

At step S41 in FIG. 6, the apex, starting point and ending point of the notch N are obtained as above. Then, the operation proceeds to step S42 at which the CPU 10 applies to the pulse generator circuit 12 the number of rotation data (500−e) corresponding to the cumulative pulse data "e" subtracted from the number of pulses for the broad stepwise rotation, along with the rotating direction control signal to cause forward rotation. As a result, the wafer W rotates forward to return to the position $\theta_{i+1}$ (FIG. 9) where the broad stepwise rotation was discontinued.

Figure 5:
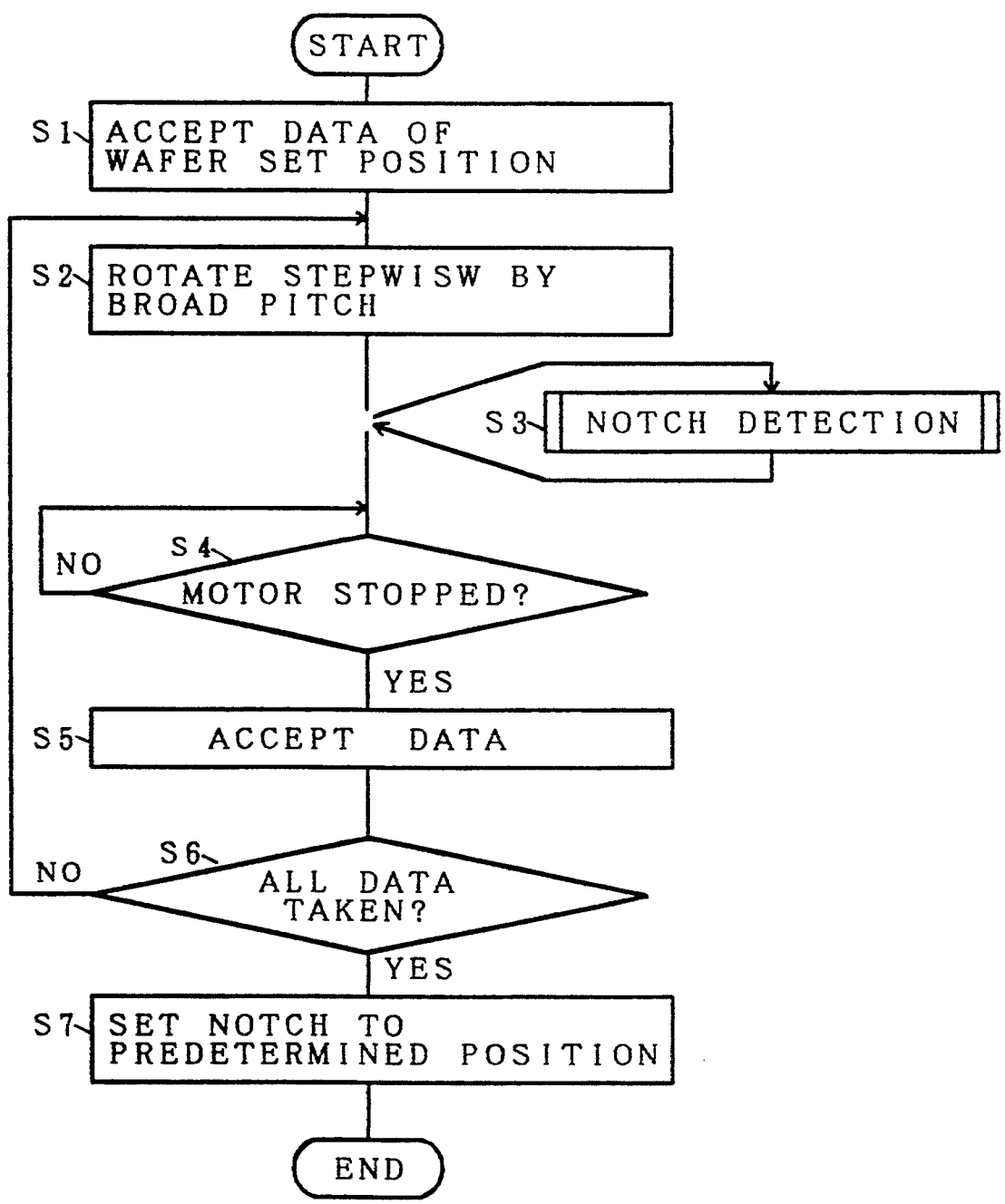
FIG. 5 is a main flowchart showing an operating sequence of the detecting apparatus.

After the above interrupt processing is carried out at step S3, the operation returns to the main routine shown in FIG. 5. After the broad stepwise rotation is started, the CPU 10 waits for the count-up signal "f" from the counter 13, and determines from input of this signal "f" that the stepper motor 2 has stopped (step S4). With the broad stepwise rotation stopped, the CPU 10 applies the data intake timing signal "a" to the analog-to-digital converter 8 to accept the outer peripheral positional data of the stopping position from the analog-to-digital converter 8 and store the data in the RAM 11 (step S5).

At step S6, the CPU 10 checks whether all the outer peripheral positional data have been taken or not, that is whether the wafer W has made one complete rotation or not. If the data intake is not completed, the operation returns to step S2 to repeat the foregoing sequence.

Once all the outer peripheral positional data have been taken, the CPU 10 reads from the RAM 11 the position data of the apex of the notch N expressed by the number of pulses for rotation $P_c$. The notch N is set to a predetermined position, e.g. a position opposed to the CCD line sensor 3, based on the number of pulses for rotation Pc, the number of steps in the broad stepwise rotation, and the cumulative pulse data "e" corresponding to the notch detecting position (step S7). When, for example, the notch N is detected between (i)th and (i+1)th steps in the broad stepwise rotation, a rotation data $1000 \times (i+1)$-e-Pc is set to the pulse generator circuit 12 to place the notch N in a position opposed to the CCD line sensor 3.

In the described embodiment, the notch is detected by monitoring variations in the outputs of the comparators 91–95. The present invention is not limited to this notch detection. For example, the notch may be detected by observing characteristic variations in the outer peripheral positional data sampled at each step in the broad stepwise rotation and stored in the RAM 11.

In the embodiment, the CPU 10 controls the pulse generator circuit 12 to generate varied numbers of pulses for switching between broad stepwise rotation and fine stepwise rotation. However, the embodiment may be modified for selective use of two pulse generator circuits which generate different numbers of pulses.

In the embodiment, the outer peripheral positional data throughout the circumference of the wafer W are obtained and stored by rotating the wafer in the broad stepwise movement for the following reason. Where, for example, the wafer W coated with photoresist is exposed over a predetermined peripheral width thereof by a light beam, an exposure light source must be moved radially of the wafer W with rotation of the wafer W. The present invention obtains the outer peripheral positional data throughout the circumference of the wafer W with a view to utilizing these data for controlling such movement of the exposure light source. Thus, for the sole purpose of detecting the notch N of the wafer W, the outer peripheral positional data need not be sampled in the course of broad stepwise rotation, but it is sufficient to sample the outer peripheral positional data of only the notched region during the fine stepwise rotation following detection of the notch.

Further, although positions of the starting point and ending point of the notch N are computed in the described embodiment, it is of course sufficient to compute only position of the apex of the notch where the region of the notch N need not be determined.

The present invention is applicable to a notch position detecting apparatus for use, for example, with an apparatus for exposing peripheries of a semiconductor wafer coated with photoresist. This position detecting apparatus may be used to set an exposure light emitter to a position opposed to a desired peripheral position of the semiconductor wafer with reference to a V-shaped notch formed peripherally of the wafer.

The present invention is applicable also to a notch position detecting apparatus for use with apparatus for carrying out various treatments on semiconductor wafers, such as an apparatus for spin-coating photoresist on a surface of a semiconductor wafer or an apparatus for forming film on a surface of a semiconductor wafer. Where a semiconductor wafer carries, in a predetermined position thereof, a marking including signs or characters showing a treating sequence and/or an index number assigned thereto, this position detecting apparatus may be used to position a marking reader relative to the wafer for reading the marking.

Further, the present invention is applicable to a notch position detecting apparatus for use in positioning a semiconductor wafer relative to a treating stage of an apparatus for treating the wafer, a measuring stage of an apparatus for measuring the wafer, or a transport stage of an apparatus for transporting the wafer.

The present invention is not limited to any particular notch position detecting apparatus used with the treating apparatus, measuring apparatus or transport apparatus.

The present invention may be embodied in other specific forms without departing from the spirit or essential attributes thereof and, accordingly, reference should be made to the appended claims, rather than to the foregoing specification, as indicating the scope of the invention.

What is claimed is:

1. A notch position detecting apparatus for detecting a notch formed peripherally in a semiconductor wafer, comprising:

rotating means for rotating said wafer;

image pickup means for detecting outline positions of said wafer;

control means for controlling and selectively driving said rotating means in stepwise rotation at a predetermined relatively broad pitch and in stepwise rotation at a predetermined relatively fine pitch;

detecting means responsive to the image pickup means for generating outer peripheral positional data of the wafer during rotation thereof, and for determining the presence or the absence of said notch;

switch means for causing said control means to rotate said rotating means at the fine pitch after said detecting means detects said notch;

storage means for storing the outer peripheral positional data generated by said detecting means;

timing means for periodically causing the outer peripheral positional data from said detecting means to be inputted into said storage means when said control means drives said rotating means at the fine pitch; and computing means for computing a notch position from the outer peripheral positional data stored in said storage means.

2. A notch position detecting apparatus as defined in claim 1, wherein said rotating means comprises a stepper motor, and said control means comprises a pulse generator circuit.

3. A notch position detecting apparatus as defined in claim 2, wherein said control means includes varying means for controlling said pulse generator circuit to vary the number of pulses generated.

4. A notch position detecting apparatus as defined in claim 3, wherein said control means further includes counter means for counting the number of pulses generated by said pulse generator circuit.

5. A notch position detecting apparatus as defined in claim 1, wherein said rotating means comprises a stepper motor, and said control means comprises two pulse generator circuits for generating different numbers of pulses.

6. A notch position detecting apparatus as defined in claim 1, wherein said image pickup means comprises one-dimensional image pickup means.

7. A notch position detecting apparatus as defined in claim 1, wherein said image pickup means has a plurality of elements.

8. A notch position detecting apparatus as defined in claim 7, wherein said wafer has a substantially circular shape and said plurality of elements are arranged along a radial direction of said wafer.

9. A notch position detecting apparatus as defined in claim 1 wherein said image pickup means comprises a charge coupled device.

10. A notch position detecting apparatus as defined in claim 1, wherein said rotating means comprises a reversible motor, and said control means includes reversal instructing means for reversing the direction of said rotating means in said stepwise rotation at the fine pitch from a rotating direction thereof in said stepwise rotation at the broad pitch.

11. A notch position detecting apparatus for detecting a notch formed peripherally in a semiconductor wafer, comprising:

rotating means for rotating said wafer;

image pickup means for detecting outline positions of said wafer;

control means for controlling and selectively driving said rotating means in rotation at a predetermined relatively high speed and in stepwise rotation at a predetermined relatively low speed and at a predetermined relatively fine pitch;

detecting means responsive to the image pickup means for generating outer peripheral positional data of the wafer during rotation thereof, and for determining the presence or the absence of said notch;

switch means for causing said control means to rotate said rotating means at the fine pitch after said detecting means detects said notch;

storage means for storing the outer peripheral positional data generated by said detecting means;

timing means for periodically causing the outer peripheral positional data from said detecting means to be read into said storage means when said control means drives said rotating means at the fine pitch; and computing means for computing a notch position from the outer peripheral positional data stored in said storage means.

12. A notch position detecting apparatus for detecting a notch formed peripherally in a semiconductor wafer, comprising:

rotating means for rotating said wafer;

image pickup means for detecting outline positions of said wafer;

control means for controlling and selectively driving said rotating means in rotation at a predetermined relatively high speed and in rotation at a predetermined relatively low speed;

detecting means responsive to the image pickup means for generating outer peripheral positional data of the wafer during rotation thereof, and for determining the presence or the absence of said notch;

switch means for causing said control means to rotate said rotating means at the low speed after said detecting means detects said notch;

storage means for storing the outer peripheral positional data generated by said detecting means;

timing means for periodically causing the outer peripheral positional data from said detecting means to be inputted into said storage means when said control means drives said rotating means at the fine pitch; and computing means for computing a notch position from the outer peripheral positional data stored in said storage means.

* * * * *